(12) United States Patent
Obradovic et al.

(10) Patent No.: US 10,461,751 B2
(45) Date of Patent: Oct. 29, 2019

(54) FE-FET-BASED XNOR CELL USABLE IN NEUROMORPHIC COMPUTING

(71) Applicant: Samsung Electronics Co., LTD., Gyeonggi-do (KR)

(72) Inventors: Borna J. Obradovic, Leander, TX (US); Ryan M. Hatcher, Austin, TX (US); Jorge A. Kittl, Austin, TX (US); Titash Rakshit, Austin, TX (US)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/137,227

(22) Filed: Sep. 20, 2018

(65) Prior Publication Data
US 2019/0280694 A1    Sep. 12, 2019

Related U.S. Application Data

(60) Provisional application No. 62/640,076, filed on Mar. 8, 2018.

(51) Int. Cl.
| | |
|---|---|
| *H01L 27/115* | (2017.01) |
| *H03K 19/0944* | (2006.01) |
| *H01L 29/51* | (2006.01) |
| *G06N 3/063* | (2006.01) |
| *H03K 19/20* | (2006.01) |
| *H01L 27/118* | (2006.01) |

(52) U.S. Cl.
CPC ....... *H03K 19/0944* (2013.01); *G06N 3/0635* (2013.01); *H01L 27/11803* (2013.01); *H01L 29/516* (2013.01); *H03K 19/20* (2013.01)

(58) Field of Classification Search
CPC ............ G06N 3/0635; H01L 27/11803; H01L 29/516; H03K 19/0944; H03K 19/20
See application file for complete search history.

(56) References Cited

U.S. PATENT DOCUMENTS

| | | | | |
|---|---|---|---|---|
| 4,541,067 A | * | 9/1985 | Whitaker | ............... G06F 7/50 |
| | | | | 326/113 |
| 5,587,668 A | * | 12/1996 | Shibata | .................. G06F 7/49 |
| | | | | 326/36 |
| 9,818,057 B2 | | 11/2017 | Nishitani | |

(Continued)

OTHER PUBLICATIONS

Borna Obradovic, Titash Rakshit, Ryan Hatcher, Jorge Kittl, Rwik Sengupta, Joon Goo Hong, and Mark S. Rodder; A Multi-Bit Neuromorphic Weight Cell Using Ferroelectric FETs, suitable for SoC Integration; Oct. 22, 2017 (Year: 2017).*

(Continued)

*Primary Examiner* — Alexander H Taningco
*Assistant Examiner* — Kurtis R Bahr
(74) *Attorney, Agent, or Firm* — Van Pelt, Yi & James LLP

(57) ABSTRACT

A computing cell and method for performing a digital XNOR of an input signal and weights are described. The computing cell includes at least one pair of FE-FETs and a plurality of selection transistors. The pair(s) of FE-FETs are coupled with a plurality of input lines and store the weight. Each pair of FE-FETs includes a first FE-FET that receives the input signal and stores a first weight and a second FE-FET that receives the input signal complement and stores a second weight. The selection transistors are coupled with the pair of FE-FETs.

20 Claims, 5 Drawing Sheets

(56) References Cited

U.S. PATENT DOCUMENTS

| | | | |
|---|---|---|---|
| 2006/0114018 A1* | 6/2006 | Sugahara | H01L 29/66984 |
| | | | 326/36 |
| 2017/0169873 A1 | 6/2017 | Appeltans | |
| 2017/0178711 A1* | 6/2017 | Morris | G11C 11/221 |
| 2017/0256552 A1* | 9/2017 | Schroder | H01L 29/78391 |
| 2018/0012123 A1 | 1/2018 | Han | |
| 2018/0039886 A1* | 2/2018 | Umuroglu | G06N 3/04 |

OTHER PUBLICATIONS

Obradovic et al., A Multi-Bit Neuromorphic Weight Cell using Ferroelectric FETs, Suitable for SoC Integration, Oct. 22, 2017.

Yin et al., Design and Benchmarking of Ferroelectic FET Based TCAM, Design, Automation, & Test in Europe Conference & Exhibition, Lausanne, pp. 1444-1449, May 15, 2017.

Yin et al., Exploiting Ferroelectric FETs for Low-Power Non-Volatile Logic-in-Memory Circuits, ICCAD'16, Nov. 7-10, 2016.

* cited by examiner

FE-FET-BASED XNOR CELL USABLE IN NEUROMORPHIC COMPUTING

CROSS-REFERENCE TO RELATED APPLICATIONS

This application claims the benefit of provisional Patent Application Ser. No. 62/640,076, filed Mar. 8, 2018, entitled "A FeFET-BASED XNOR CELL FOR BINARY OR TERNARY NEUROMORPHIC COMPUTING", assigned to the assignee of the present application, and incorporated herein by reference.

BACKGROUND

Applications involving Deep-Learning Neural Networks (NNs) or neuromorphic computing such as image recognition, natural language processing and more generally various pattern-matching or classification tasks are quickly becoming as important as general-purpose computing. The essential computational element of the NN, or neuron, multiplies of a set of input signals by a set of weights and sums the products. Thus, the neuron performs a vector-matrix product, or multiply-accumulate (MAC) operation. A NN generally includes a large number of interconnected neurons, each of which performs a MAC operation. Thus, operation of a NN is computationally intensive.

Performance of a NN may be improved by improving the efficiency of the MAC operation. It would be desirable to store weights locally to reduce power and the frequency of DRAM accesses. It may also be desirable to perform the MAC operation digitally to aid in reducing noise and process variability. A binary neuron may be capable of meeting these goals. Thus, a binary-weighted XNORNet has been developed.

In a binary XNOR cell, the weights, w, are mathematically 1 and −1 but are represented digitally as 1 and 0. The signals, x, are likewise mathematically 1 and −1, but represented digitally by 1 and 0. The result of the multiplication operation $p_i = w_i x_i$ is positive only when x and w are both 1, and when they are both mathematically −1 (both 0 in Boolean representation). This is just the logical negation of the exclusive-OR operation (XNOR). Thus, the product of individual weights and signals can be expressed as $p_i = XNOR(w_i, x_i)$. The complete MAC operation for a given neuron is expressed as $$\text{sum} = \sum_{\{i=1\}}^{n} w_i x_i,$$

or in Boolean terms, sum=2 Count(XNOR(w,x))−n. The count operation counts the number of non-zero results of the XNOR expression, while n is the total number of inputs to the neuron. The result is then thresholded against a bias, resulting in a high or low output of the neuron. The entire process is digital. Consequently, no information loss associated with analog processing is incurred.

However, the use of the binary representation of the weights can be a source of information loss. Binary networks typically use substantially more neurons than analog (or multi-bit digital) networks to obtain the same level of overall accuracy. A significant improvement may be possible if the weights are ternary, rather than binary. Ternary weights take on the mathematical values −1, 0, and 1. The 0 weight produces the −1 output (logical 0) for any combination of inputs. Thus, the output of a ternary XNOR gate (also referred to as a "Gated XNOR") is given by:

$$p_i = \begin{cases} XNOR(w_i, x_i) & \text{if } w_i = -1 \text{ or } 1 \\ -1 & \text{if } w_i = 0 \end{cases}$$

When performing the XNOR operation in the above equation, the nonzero weights and all signals are mapped from the {−1, 1} domain to the {0, 1} Boolean domain. The mapping is performed after the branching based on the mathematical value of the weight.

Ternary networks may provide improved accuracy over binary networks when using the same number of neurons. Alternatively, ternary networks can achieve the same level of accuracy as binary networks, but with a smaller number of neurons. This results in savings on area, power, and inference throughput and latency. Thus, both binary and ternary digital XNOR networks may be used in applications such as NNs. What is desired is an improved XNOR logic cell to enhance operation of digital binary and/or ternary NNs or other logic operations.

DETAILED DESCRIPTION OF THE INVENTION

Figure 1:
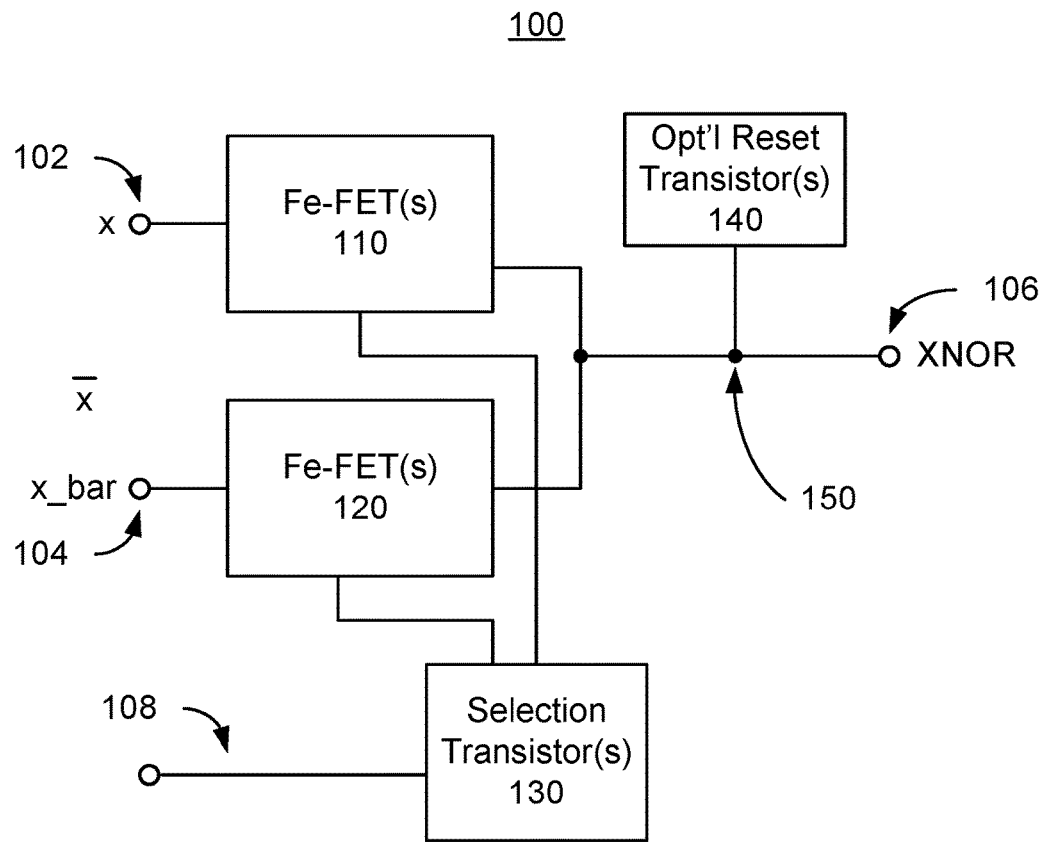
FIG. 1 is a block diagram depicting an exemplary embodiment of a digital XNOR computing cell.

The exemplary embodiments relate to digital computing cells that perform XNOR operations and that may be employed in a variety of fields including but not limited to machine learning, artificial intelligence, neuromorphic computing and neural networks. The method and system may be extended to other applications in which logic devices are used. The following description is presented to enable one of ordinary skill in the art to make and use the invention and is provided in the context of a patent application and its requirements. Various modifications to the exemplary embodiments and the generic principles and features described herein will be readily apparent. The exemplary embodiments are mainly described in terms of particular methods and systems provided in particular implementations. However, the methods and systems will operate effectively in other implementations.

Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or fewer components than those shown, and variations in the arrangement and type of the components may be made without departing from the scope of the invention. The exemplary embodiments will also be described in the context of particular methods having certain steps. However, the method and system operate effectively for other methods having different and/or additional steps and steps in different orders that are not inconsistent with the exemplary embodiments. Thus, the present invention is not intended to be limited to the embodiments shown, but is to be accorded the widest scope consistent with the principles and features described herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. Further, unless defined otherwise, all terms defined in generally used dictionaries may not be overly interpreted.

A computing cell and method for performing a digital XNOR of an input signal and weights are described. The computing cell includes at least one pair of FE-FETs and a plurality of selection transistors. The pair(s) of FE-FETs are coupled with a plurality of input lines and store the weight. Each pair of FE-FETs includes a first FE-FET that receives the input signal and stores a first weight and a second FE-FET that receives the input signal complement and stores a second weight. The selection transistors are coupled with the pair of FE-FETs.

FIG. 1 is a block diagram depicting an exemplary embodiment of a digital XNOR computing cell 100. For simplicity, only a portion of the XNOR cell 100 is shown. The computing cell 100 digitally performs the XNOR operation on an input signal and a weight. Thus, the computing cell 100 can be considered a neuromorphic computing cell. Further, the computing cell 100 may perform a binary or ternary XNOR operation.

The computing cell 100 includes at least two ferroelectric field-effect transistors (FE-FETs) 110 and 120, selection transistors 130 and optional reset transistor(s) 140. Also shown are input lines 102 and 104 and output lines 106 and 108. The input lines 102 and 104 receive the input signal and its complement, respectively, for an inference operation. The output line 106 provides the resultant of the XNOR operation. Select line 108 may be used to select the computing cell 100 for operation, for example if the computing cell 100 is part of a neural network (NN).

The computing cell 100 includes at least two FE-FETs 110 and 120. In other embodiments, more than two FE-FETs may be used, but at a cost to cell density. In other embodiments, each computing cell includes only two FE-FETs 110 and 120. Each of the FE-FET 110 and 120 includes a ferroelectric layer (not explicitly shown in FIG. 1) that generally resides between two metal layers, forming a ferro-electric capacitor, and a transistor (e.g. a FET). In alternate embodiments, the ferroelectric layer may replace the gate oxide. The ferroelectric layer stores the weight via the polarization state of the ferroelectric layer. For example, the ferroelectric layers may include at least one of PbZrTi, HfZrO, BaTiO$_3$, B$_{12}$TiO$_{20}$, GeTe, and Ba$_x$Eu$_{1-x}$TiO$_3$, where x is greater than zero and not more than one. In other embodiments, another and/or additional ferroelectric material(s) may be used.

In operation, reset-evaluate logic may be used. Thus, the storage node 150 may be reset at the start of an inference operation (i.e. an XNOR operation using previously programmed weights). To perform an inference operation, the input, x, and its complement, x_bar, are provided to the FE-FETs 110 and 120 via input lines 102 and 104, respectively. The polarizations of the ferroelectric layers within the FE-FETs 110 and 120 vary based upon the weights programmed into the FE-FETs 110 and 120. During the inference operation, a selective pull-up is performed on the dynamic storage node 150. The dynamic storage node voltage may then be output via output line 106 in order to evaluate, or provide the resultant of, the XNOR operation. Thus, the FE-FETs 110 and 120 are connected such that the output line 106 provides the XNOR of the input signal x with the weight, w, stored by the FE-FETs 110 and 120. Selection transistor(s) 130 select the XNOR cell 100 for operation. Optional reset transistor(s) 140 may be used to explicitly reset the computing cell 100, for example for ternary operation. In other embodiments, the reset operation may be performed in another manner. Thus, the computing cell 100 may be used in a binary or a ternary mode.

The computing cell 100 may carry out the XNOR operation efficiently and may be implemented in a relatively compact manner. Because the operation is digital, issues with analog XNOR operations may be reduced or eliminated. For example, the use of digital weights results in programming robustness of the FE-FETs 110 and 120. Digital operation may also result in less noise for the output 106. The use of an ADC may be avoided and power and area may also be saved. The weights are also stored locally in the FE-FETs 110 and 120, which function as nonvolatile memory. The inference operation may be made more efficient and faster. As discussed below, the computing cell 100 may provide a binary or ternary XNOR. The computing cell 100 may, therefore, perform XNOR operations digitally, efficiently and reliably.

Figure 2:
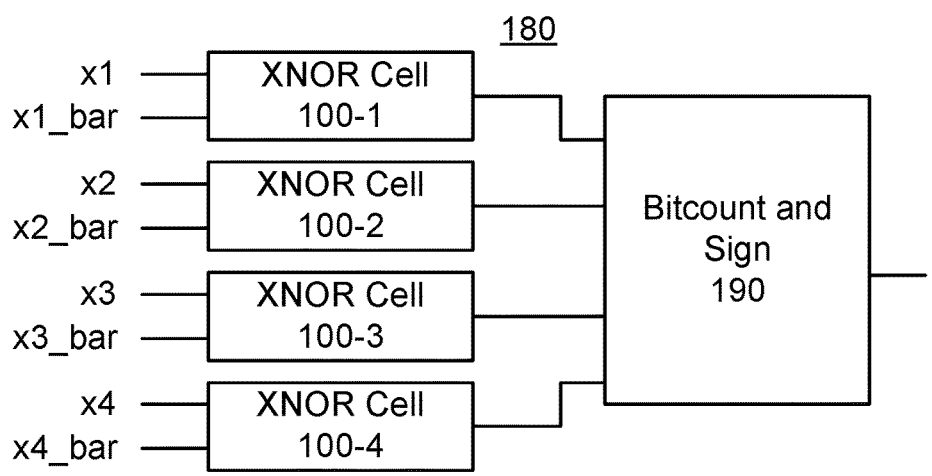
FIG. 2 is a block diagram depicting an exemplary embodiment of a portion of a neural network including multiple XNOR computing cells and performing a multiple-and-accumulate operation.

FIG. 2 is a block diagram depicting an exemplary embodiment of a portion 180 of a digital neural network. The portion 180 may be considered to be a neuron. The neuron 180 performs a multiply-and-accumulate (MAC) operation. The neuron 180 illustrates a possible use of the computing cell 100 and is not intended to be limiting.

The neuron 180 includes multiple computing cells 100-1, 100-2, 100-3 and 100-4 (collectively computing cells 100) and bit count and sign block 190. In this embodiment, four inputs x1, x2, x3 and x4 are desired to be combined with four weights. Consequently, four computing cells 100 are used to perform four XNOR operations. In an alternate embodiment, another number of computing cells 100 might be used. Each of the computing cells 100-1, 100-2, 100-3 and 100-4 shown in FIG. 2 operate in a manner analogous to the computing cell 100 depicted in FIG. 1. The bit count and sign block 190 counts the number of non-zero results from the four XNOR cells 100 and subtracts four (the number of input signals to the neuron 180). The result is then thresholded against a bias, resulting in a high or low output of the neuron 180.

The neuron 180 using the computing cells 100 may thus perform a MAC operation. Because it uses cells implemented in hardware, the neuron 180 operates efficiently. The MAC operation may be performed digitally, which avoids issues with analog XNOR operations. As discussed with respect to FIG. 1, the XNOR operations performed by the computing cells 100 may also be compact, efficient and operate in binary or ternary modes. Performance of the neuron 180 may, therefore, improve.

Figure 3:
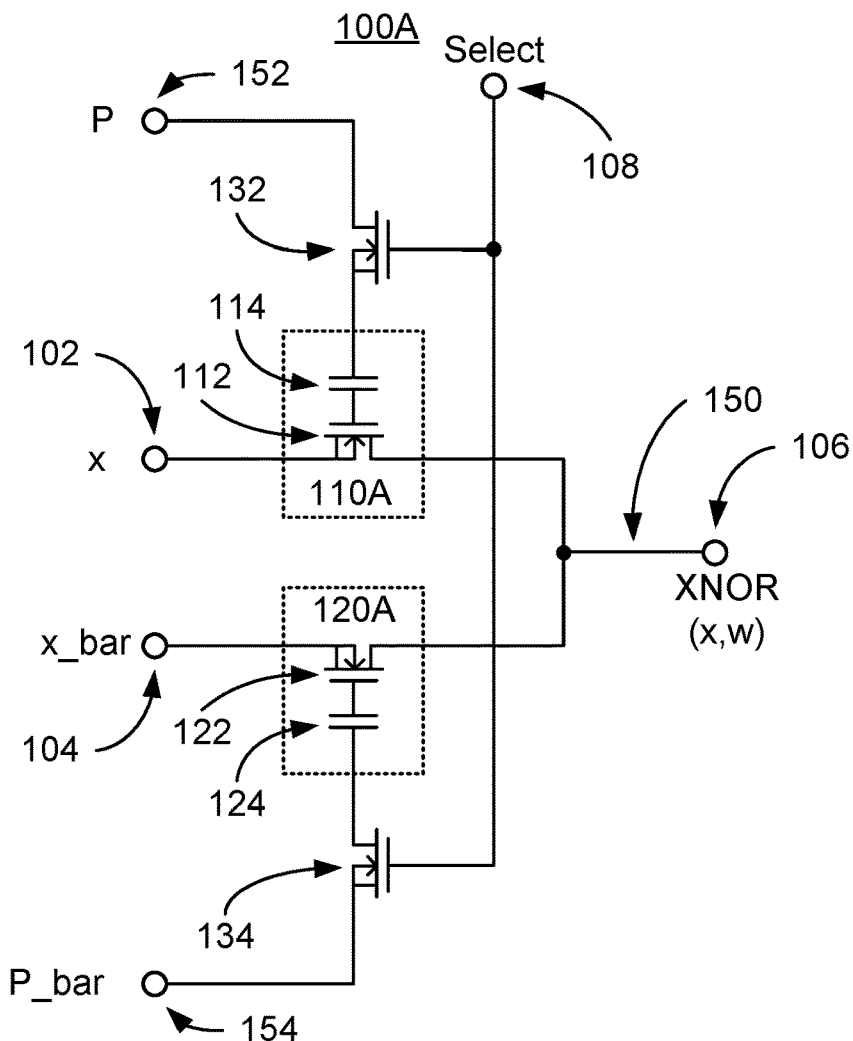
FIG. 3 depicts an exemplary embodiment of a computing cell for performing a digital XNOR operation.
Figure 4:
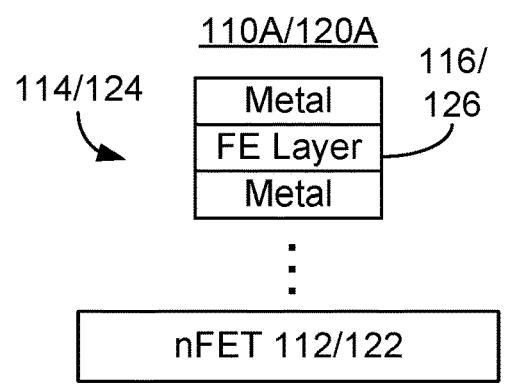
FIG. 4 depicts an exemplary embodiment of a portion of an FE-FET usable in the computing cell that performs a digital XNOR operation.

FIG. 3 depicts a schematic of an exemplary embodiment of a computing cell 100A for performing a digital XNOR operation. The computing cell 100A is analogous to the XNOR cell 100 and may be used in the neuron 180 or other application. Consequently, portions of the computing cell 100A analogous to components in the XNOR cell 100 are labeled similarly. Thus, the XNOR cell 100A includes input lines 102 and 104, FE-FETs 110A and 120A, selection transistors 132 and 134, output line 106 and select line 108 that are analogous to input lines 102 and 104, FE-FETs 110 and 120, selection transistors 130, output line 106 and select line 108, respectively. Also shown are dynamic output node 150 and program lines 152 and 154. In the embodiment shown, the selection transistors 132 and 134 are n-FETs. The FE-FETs 110A and 120A are shown as including FETs 112 and 122, respectively, and ferroelectric capacitors 114 and 124, respectively, having ferroelectric layers. For example, FIG. 4 depicts an exemplary embodiment of a portion of an FE-FET 110A/120A usable in the computing cell that performs a digital XNOR operation. The FE-FET 110A/120A includes a FET 112/114 and a capacitor 114/124. The dielectric layer 116/126 may include one or more of PbZrTi, HfZrO, $BaTiO_3$, $B_{12}TiO_{20}$, GeTe, and $Ba_xEu_{1-x}TiO_3$, where x is greater than zero and not more than one. In some embodiments, the ferroelectric layers 116/126 is incorporated into the first metal (M1) layer. In other embodiments, the ferroelectric layers 116/126 may be incorporated into other layers.

The input lines 102 and 104 carry input signal x and its complement x_bar, respectively. Input lines 102 and 104 are connected to the sources of the FE-FETs 110A and 120A, respectively. The gates of the FE-FETs 110A and 120A are connected to program lines 152 and 154, respectively, via selection transistors 132 and 134, respectively. The program lines 152 and 154 provide the program signal, P, and its complement, P_bar, respectively. The drains of the FE-FETs are coupled together and form dynamic output node 150. The selection transistors 132 and 134 have their sources connected to the FE-FETs 110A and 120A, respectively, their drains connected to the program lines 152 and 154, respectively, and their gates connected to the select line 108.

As discussed above, the weights stored in the FE-FETs 110A and 120A are determined by the polarization of the ferroelectric layers 114 and 124. These weights may be trained off-chip. For example, if the intended applications of the computing cell 100A are inference only (off-chip training), erase and program operations are performed infrequently. Therefore, the FE-FETs 110A and 120A may only be programmed when the weights are desired to be changed. This may occur only a few times per year in some embodiments, for example to account for improvements in the off-chip training. In alternate embodiments, the FE-FETs 110A and 110B may be programmed more frequently or less frequently.

The weights programmed into the FE-FETs 110A and 110B depend upon whether the computing cell 100A is desired to be used in a binary or ternary mode. The stored states in the two FE-FETs 110A and 110B may be complements for non-zero weights or equal (e.g. setting a high-Vt state for both) for the zero weight. Use of a zero weight may occur for ternary operation or zero weight.

In order to program the weights, the computing cell 100A is first erased and then programmed. If present in an array, all of the computing cells 100 in the entire array may be first erased globally and the individual non-zero bits then programmed. To erase the cell 100A (and all the cells in the array), the signals P and P_bar on program lines 152 and 154 are both set low (e.g. to ground) and the inputs x and x_bar on input lines 102 and 104 are both set high. The output line 106 of the computing cell 100A is allowed to float. The result is a negative voltage across the ferroelectric capacitor 114 and 124 in every FE-FET 110A and 120A, respectively, in the cell 100A and the array. After the end of the erase, every FE-FET 110A and 120A has a small, zero or slightly negative voltage on the node for the gate of the underlying FET 112 and 122 in the FE-FET 110A and 120A. This puts all the FE-FETs 110A and 120A in a low-conductivity state.

Figure 5:
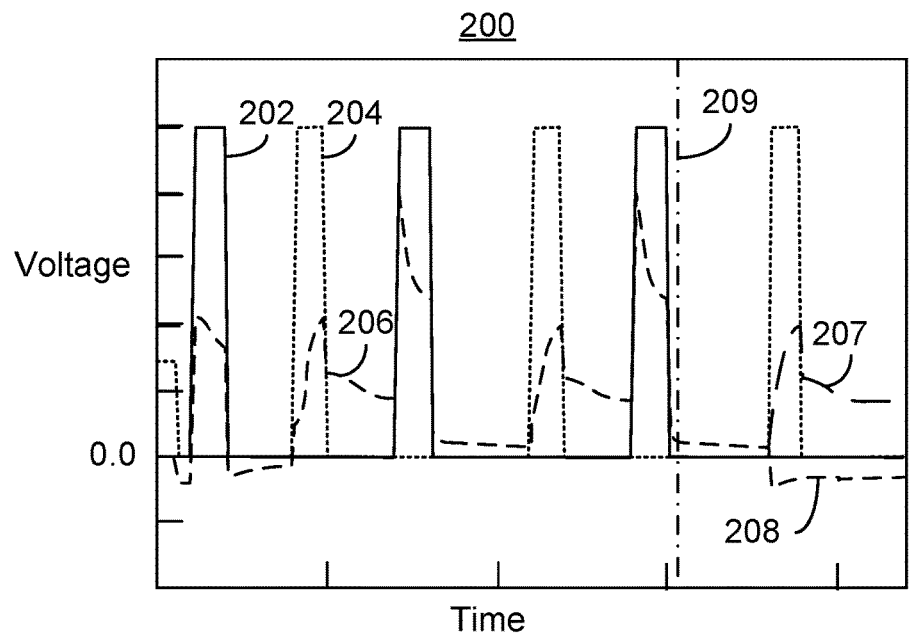
FIG. 5 is a timing diagram depicting programming of an exemplary embodiment of the computing cell that performs a digital XNOR operation.

FIG. 5 is a timing diagram 200 depicting programming of an exemplary embodiment of the computing cell that performs a digital XNOR operation. In the embodiment shown in FIG. 5, the program lines 152 and 154 are pulsed to a moderately high voltage, such as 2.5V-3V. Referring to FIGS. 3 and 5, solid line 202 represents the voltage applied to the program lines 152 and 154, dotted line 202 represents the input voltages x or x_bar on the input lines 102 and 104. Dashed line 206 is the voltage at the gates of the FETs 114 and 124 for the FE-FETs 110A and 120A through erasure. The applied voltages to the left of vertical line 209 represent voltages applied that can erase the FE-FETs 110A and 120A. Erasure is complete at line 209. Consequently, the voltage at the node of the gates of the FE-FETs 110A and 120A is small just to the right of the line 209. Thus, both FE-FETs 110A and 120A have been erased to a low gate voltage.

Figure 6:
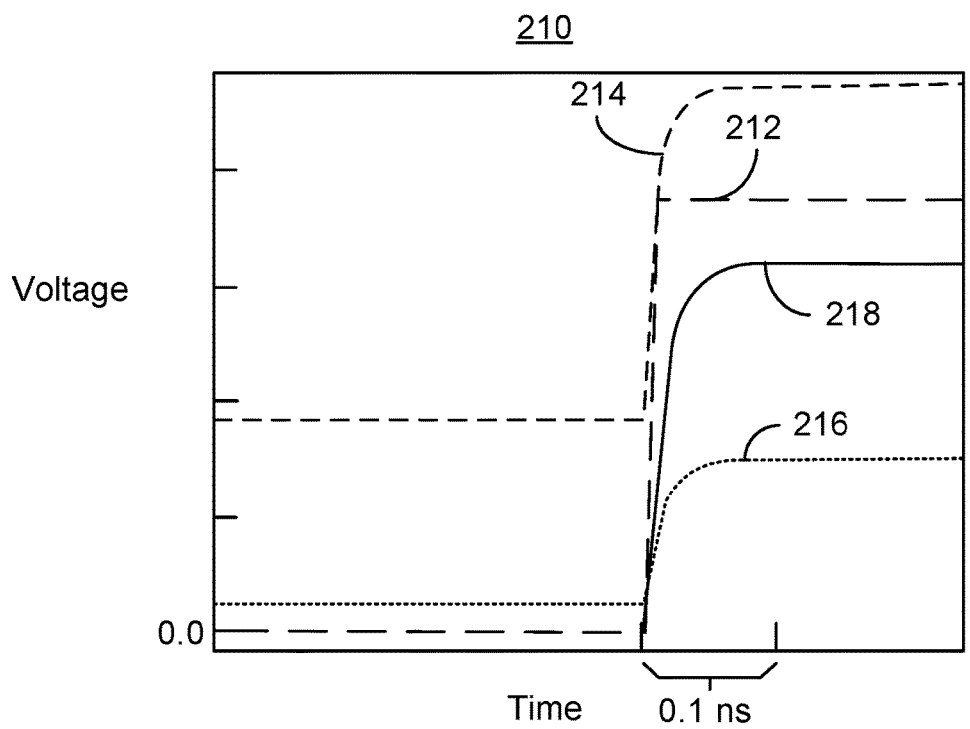
FIG. 6 is a diagram depicting timing of an inference operation for an exemplary embodiment of the computing cell that performs a digital XNOR operation.

After the erase is completed, the FE-FETs 110A and 120A may be programmed. A program event sets individual bits, that represent the mathematical weights stored by the FE-FETs 110A and 120A. If ternary operation is desired, only the non-zero weights are programmed. Programming is accomplished by grounding the signal inputs lines 102 and 104 (x, x_bar low) and applying a high voltage to either the program line 152 (P high) or to program line 152 (P_bar high). The select line 108 is turned on for each computing cell 100A being programmed. The high voltage on the program lines 152 or 154 results in a positive voltage across the ferroelectric capacitor 114 or 124, respectively, in each FE-FET 110A and 120A, respectively. Consequently, a change of polarization state results. The gate node of each FE-FET is now programmed to a high positive voltage, setting the underlying FET to a conductive state. In FIG. 5, gate voltage of the final programmed state of the FE-FET 110A (that may store the weight) is shown by dashed line 207, while gate voltage for the final programmed state of the FE-FET 120A (that may store the weight complement) is shown by dashed line 208. Thus, one or both of the FE-FETs 110A and 120A may be programmed. In FIG. 5, the gate voltages 207 and 208 differ. In some embodiments, the final voltage difference between the ON and OFF-state FETs is roughly 500 mV. This may correspond to generic 7 nm node FETs. The voltage difference can be significantly increased by improving the ratio of ferroelectric to non-ferroelectric polarization of the ferroelectric capacitors 114 and 124. For example, a thicker ferroelectric capacitor/thicker ferroelectric layer 116/126 with stronger ferroelectric polarization may be used. Thus, weights may be programmed into the FE-FETs 110A and 110B using an erase-program In order to perform an inference operation, the input and its complement, x and x_bar, are provided on input lines 102 and 104, respectively. The select line 108 is driven low. Thus, the gates of the FE-FETs 110A and 120A are allowed to float. The gates of the FE-FETs 110A and 120A may be allowed to float to allow the gate voltage to exceed the supply voltage during an inference operation and provide a full output swing. The difference in the ferroelectric voltage is desired to be minimized or reduced to suppress read disturbances. The output of the computing cell 100A (an XNOR of the input x and the weight) may be developed on the storage node 150. Thus, the inference operation may be performed. The times for performing an inference operation may also be kept small. For example, FIG. 6 is a diagram 320 depicting timing of an inference operation for an exemplary embodiment of the computing cell that performs a digital XNOR operation. Dashed line 212 indicates the transition of the input x from low to high on input line 102. Dashed line 214 and dotted line 216 indicate the voltages developed on the gates of the FE-FETs 110A and 120A (i.e. the gates of transistors 112 and 122, respectively) during the inference operation. As can be seen in FIG. 6, the settling to the final voltage may occur in less than 0.1 ns.

Thus, the computing cell 100A may have improved performance. The computing cell 100A may utilize only two FE-FETs 110A and 120A in combination with two selection nFETs 132 and 134. Thus, the computing cell 100A may be compact. Because the FE-FETs 110A and 120A may be programmed digitally, programming may be robust. The weights are stored locally, via the polarization of the ferroelectric layers 116/126. Time and power are saved because weights need not be accessed from off-chip DRAM. Because the computing cell 100A may perform the XNOR (inference) operation digitally, the output developed on the storage node 150 may exhibit reduced noise in comparison to analog implementations. Further, the inference operation is performed quickly and efficiently. The computing cell 100A may be robust to read disturb. The gate node of the FE-FETs (the tope node of the ferroelectric capacitors 114 and 124 floats during inference. Thus, the inference event asserts very little voltage across the ferroelectric capacitor 114/124 itself. Furthermore, this small voltage increment takes place on a much smaller timescales than the ferroelectric polarization response of standard ferroelectric materials. As discussed above with respect to FIG. 6, inference times can reasonably be kept to under 0.1 ns. This time scale may be much smaller than the times for a ferroelectric response of standard ferroelectric materials. This is because no change in ferroelectric polarization is desired during an inference operation. This response time is approximately two orders of magnitude faster that the PbZrTi response, and at least a few orders of magnitude faster than HfZrO response. Thus, no change in the polarization of the ferroelectric layers 116/126 is expected. Consequently, repeated inference events may have little to no impact on the gate node voltages in the FE-FETs 110A and 120A. This indicates there has been no change in polarization state of the ferroelectric layers 116/126. Thus, the inference/read operations may not disturb the programmed state of the FE-FETs 110A and 120A.

The computing cell 100A may also be used in ternary operation. For ternary operation, the full weight set {1, 0, −1} is used. For a zero weight, the computing cell 100A is not programmed after the erase discussed above. In other words, the erase-program operation is completed simply by erasing the computing cell 100A. However, there is the possibility of charge accumulation from repeated inference at the storage node 150. This may occur because the natural discharge rate of the dynamic storage node 150 is low compared to the inference rate when both FE-FETs 110A and 120A are turned off (as is the case for the zero weight). In order to prevent this charge accumulation, an explicit RESET is performed prior to each inference for ternary operation. In the XNORNet case, the initially grounded state of x and x_bar for input lines 102 and 104 is sufficient to discharge the storage node 150 through the FeFET(s) 110A and/or 120A.

In one embodiment, the computing cell 100A may be used without any additional transistors or interconnects. In such an embodiment, the storage node 150 is discharged through the FE-FETs 110A and 120A. However, the conductivity of the FE-FETs 110A and 120A is increased by applying a high voltage to the program lines 152 and 154, respectively, while the select transistors 132 and 134 are turned on. The added gate voltage on the FE-FETs 110A and 120A makes the normally off FE-FETs 110A and 120A temporarily more conductive. This higher conductivity of the FE-FETs 110A and 120A enables a rapid discharge of the storage node 150. Although this approach functions, high-voltage pulsing of the program lines 152 and 154 occurs at every inference. This results in increased power and voltage stress on the select transistors 132 and 134, which would otherwise be stressed very infrequently. Alternatively, a different embodiment of the computing cell may be used.

Figure 7:
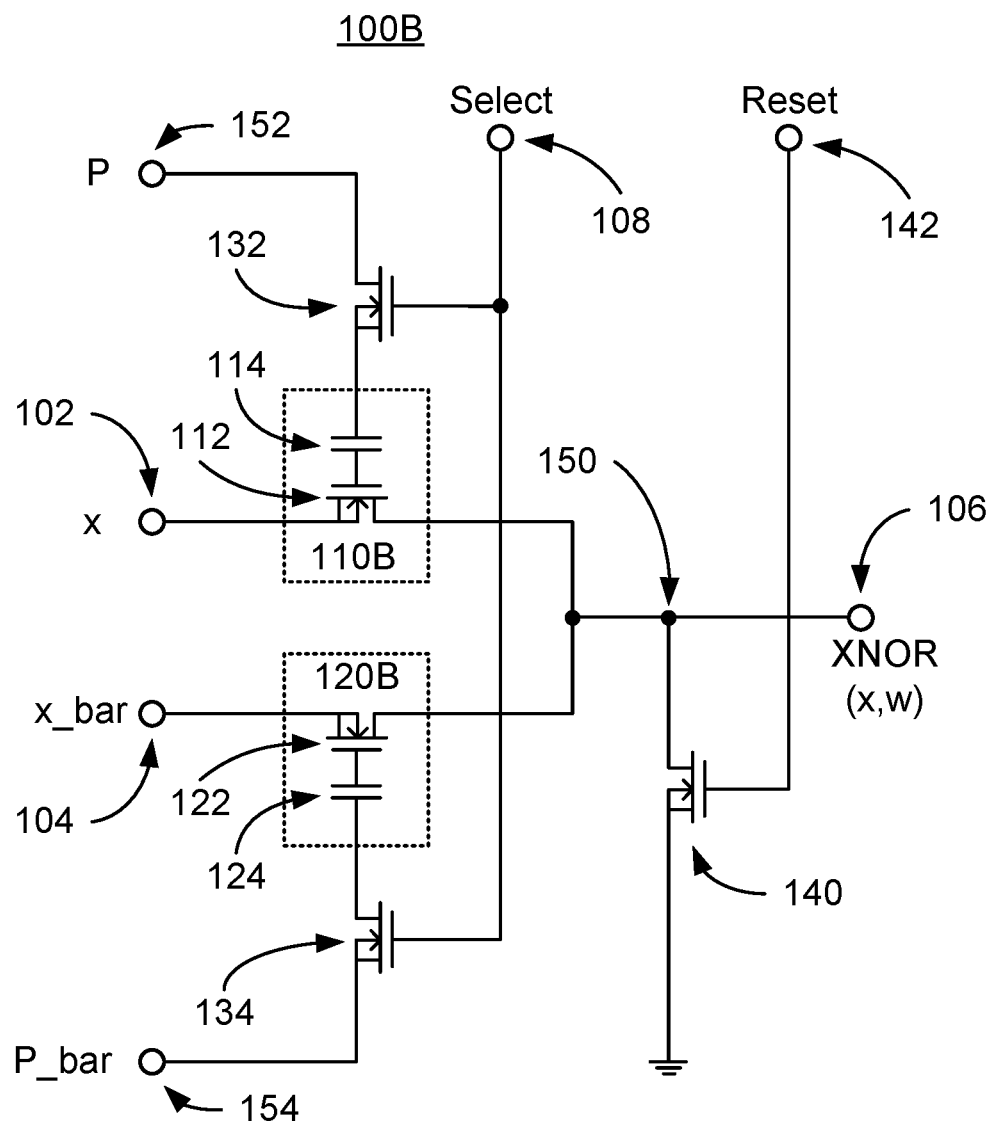
FIG. 7 depicts another exemplary embodiment of a computing cell for performing a digital XNOR operation.

FIG. 7 depicts another exemplary embodiment of a computing cell 100B for performing a digital XNOR operation with an explicit reset operation. The computing cell 100B is analogous to the XNOR cell 100 and computing cell 1008. The computing cell 100B may thus be used in the neuron 180 or other application. Consequently, portions of the computing cell 100A analogous to components in the cells 100/100A are labeled similarly. Thus, the computing cell 100B includes input lines 102 and 104, FE-FETs 110B and 120B, selection transistors 132 and 134, output line 106 and select line 108 that are analogous to input lines 102 and 104, FE-FETs 110/110A and 120/120A, selection transistors 130/132 and 134, output line 106 and select line 108, respectively. Also shown are dynamic output node 150 and program lines 152 and 154 that are analogous to those shown in FIG. 3. The selection transistors 132 and 134 are n-FETs. The FE-FETs 1108 and 120B includes FETs 112 and 122, respectively, and ferroelectric capacitors 114 and 124, respectively, having ferroelectric layers. The FETs 112 and 122 and ferroelectric capacitors 114 and 124 are analogous to those shown in FIG. 3. The dielectric layer (not labeled in FIG. 7) may include one or more of PbZrTi, HfZrO, BaTiO$_3$, B$_{12}$TiO$_{20}$, GeTe, and Ba$_x$Eu$_{1-x}$TiO$_3$, where x is greater than zero and not more than one. The structure and function of the components 102, 104, 106, 108, 110B, 112, 114, 120B, 122, 124, 132, 134, 150, 152 and 154 are analogous to the like numbered components in FIGS. 2-4.

The computing cell 100B also includes a reset transistor 140, which may be an n-FET, as well as a reset line 142. The gate of the reset transistor 140 is coupled to the reset line 140, while the source is coupled to ground. To erase the FE-FETs 110B and 120B, the reset line 142 is set low, the program lines 152 and 154 are pulsed low, and the input lines 102 and 104 are set high. For an inference/XNOR operation, the reset FET 140 is turned on by energizing the reset line 142 prior to the inputs x and x_bar being applied 102 and 104, respectively. Thus, use of the reset transistor 140 discharges the storage node 150. The input x and x_bar may then be applied and an inference operation may be performed. As a result, the high voltages discussed above may be avoided while using the computing cell 100B in the ternary mode. The choice between utilizing the smaller computing cell 100A with a high voltage applied to the program lines 152 and 154 and the larger computing cell 100A with a reset FET 140 but that does not employ high voltages depends upon the targets and technology constraints.

Figure 8:
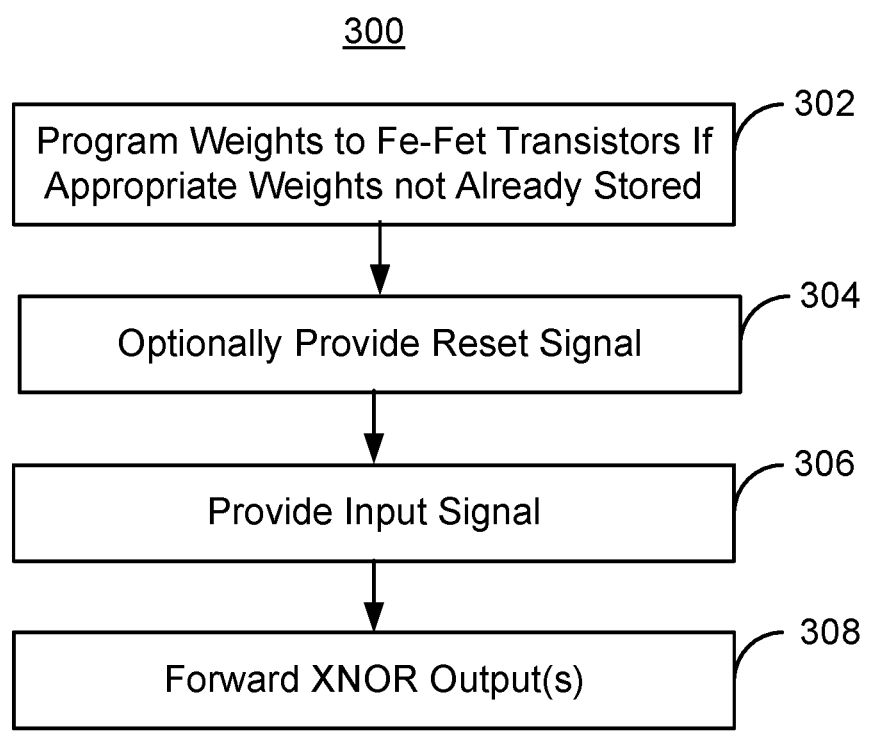
FIG. 8 is a flow chart depicting an exemplary embodiment of a method for performing an XNOR operation using an exemplary embodiment of the computing cell.

FIG. 8 is a flow chart depicting an exemplary embodiment of a method for performing an XNOR operation using an exemplary embodiment of the hardware cell. For simplicity, some steps may be omitted, performed in another order and/or combined. The method 300 is also described in the context of the XNOR cell(s) 100/100A/100B. However, the method 300 may be used in connection with another XNOR computing cell.

The weights are programmed into the FE-FETs 110/110A/110B and 120/120A/120B, via step 302. Step 302 may thus be performed as described above. For example, step 302 may include an erase of the computing cell 100/100A/100B followed by a programming step. Although shown as part of the flow 300, the step 302 may be carried out well before and be decoupled from the remaining steps of the method 300.

The reset line 142 is optionally driven high, then low to enable the reset transistor 140, via step 304. Step 304 is performed for the computing cell 100B. Alternatively, the FE-FETs 110A and 120A may be reset via applied voltages. The signal and its complement are received, via step 306. Step 302 may include receiving x_value and x_value_bar in the input lines 102 and 104, respectively. The inference operation is performed as described above. The resultant of the XNOR operation may then be forwarded, via step 308.

Thus, using the method 300, the XNOR cells 100, 100A, 100B and/or an analogous device may be used. As a result, the advantages of one or more the XNOR cells 100, 100A, 100B and/or analogous device may be achieved. A method and system for performing digital XNOR operations using a compact FE-FET computing cell 100/100A/100B in either binary or ternary mode has been described. The method and system have been described in accordance with the exemplary embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

We claim:

1. A computing cell for performing a XNOR operation of an input signal with a weight comprising:
    at least one pair of FE-FETs coupled with a plurality of input lines and storing the weight, the at least one pair of FE-FETs including a first FE-FET and a second FE-FET, the first FE-FET receiving the input signal and storing a first weight, the second FE-FET receiving the input signal complement and storing a second weight, the first FE-FET and the second FE-FET being coupled to form a dynamic storage node;
    a plurality of selection transistors coupled with the at least one pair of FE-FETs; and
    a reset transistor having a reset transistor source, a reset transistor gate and a reset transistor drain, the reset transistor source being connected to the dynamic storage node, the reset transistor gate being coupled with a reset line.

2. The computing cell of claim 1 wherein the plurality of selection transistors includes a first selection transistor and a second selection transistor, each of the selection transistors including a gate, a source and a drain, the source of the first selection transistor being connected a first gate of the first FE-FET, the source of the second selection transistor being connected to a second gate of the second FE-FET, the gate of the first selection transistor and the gate of the second selection transistor being coupled to a select line.

3. The computing cell of claim 2 wherein the drain of the first selection transistor is coupled with a program line and the drain of the second selection transistor is coupled with a program complement line.

4. The computing cell of claim 1 wherein the first FE-FET includes a first drain and a first source coupled with a first input line of the plurality of input lines and wherein the second FE-FET includes a second source coupled with a second input line of the plurality of input lines and a second drain, the second drain being coupled with the first drain to provide the dynamic storage node.

5. The computing cell of claim 1 wherein the first FE-FET includes a first ferroelectric material, the second FE-FET includes a second ferroelectric material, the first ferroelectric material and the second ferroelectric material including at least one of PbZrTi, HfZrO, BaTiO$_3$, B$_{12}$TiO$_{20}$, GeTe, and Ba$_x$Eu$_{1-x}$TiO$_3$, where x is greater than zero and not more than one.

6. The computing cell of claim 1 wherein the first weight and the second weight complement are complements for the weight being nonzero and equal for the weight being zero.

7. The computing cell of claim 1 wherein the plurality of FE-FET transistors consists of the first FE-FET and the second FE-FET and the plurality of selection transistors consists of a first selection transistor and a second selection transistor.

8. A computing cell for performing a XNOR operation of an input signal with a weight comprising:
    at least one pair of FE-FETs coupled with a plurality of input lines and storing the weight, the at least one pair of FE-FETs including a first FE-FET and a second FE-FET, the first FE-FET receiving the input signal and storing a first weight, the second FE-FET receiving the input signal complement and storing a second weight, the first FE-FET including a first drain and a first source coupled with a first input line of the plurality of input lines, the second FE-FET including a second source coupled with a second input line of the plurality of input lines and a second drain, the second drain being coupled with the first drain to provide a dynamic storage node;
    a plurality of selection transistors coupled with the at least one pair of FE-FETs; and
    a reset transistor having a reset transistor source, a reset transistor gate and a reset transistor drain, the reset transistor source being connected to the dynamic storage node, the reset transistor gate being coupled with a reset line.

9. A neural network comprising:
    a plurality of input lines;
    a plurality of XNOR cells, each of the plurality of XNOR cells for performing a digital XNOR operation of an input signal with a weight, each of the plurality of XNOR cells including at least one pair of FE-FETs, a plurality of selection transistors coupled with the at least one pair of FE-FETs and a reset transistor having a reset transistor source, a reset transistor gate and a reset transistor drain, the at least one pair of FE-FETs coupled with a portion of the plurality of input lines and storing the weight, the at least one-pair of FE-FETs including a first FE-FET and a second FE-FET, the first FE-FET receiving the input signal and storing a first weight, the second FE-FET receiving the input signal complement and storing a second weight, the first FE-FET and the second FE-FET being coupled to form a dynamic storage node, the reset transistor source being connected to the dynamic storage node, the reset transistor gate being coupled with a reset line.

10. The neural network of claim 9 wherein the plurality of selection transistors includes a first selection transistor and a second selection transistor, each of the selection transistors including a gate, a source and a drain, the source of the first selection transistor being connected a first gate of the first FE-FET, the source of the second selection transistor being connected to a second gate of the second FE-FET, the gate of the first selection transistor and the gate of the second selection transistor being coupled to a select line, the drain of the first selection transistor is coupled with a program line and the drain of the second selection transistor is coupled with a program complement line and wherein the plurality of FE-FETs consists of the first FE-FET and the second FE-FET.

11. The neural network of claim 10 wherein the first FE-FET includes a first drain and a first source coupled with a first input line of the plurality of input lines and wherein the second FE-FET includes a second drain and a second source coupled with a second input line of the plurality of input lines, the first drain being coupled with the second drain to form the dynamic storage node.

12. The neural network of claim 9 wherein the first FE-FET includes a first ferroelectric material, the second FE-FET includes a second ferroelectric material, the first ferroelectric material and the second ferroelectric material including at least one of PbZrTi, HfZrO, $BaTiO_3$, $B_{12}TiO_{20}$, GeTe, and $Ba_xEu_{1-x}TiO_3$, where x is greater than zero and not more than one, and wherein the first ferroelectric material and the second ferroelectric material are integrated at a first metal layer or higher for the neural network.

13. A neural network comprising:
a plurality of input lines;
a plurality of XNOR cells, each of the plurality of XNOR cells for performing a digital XNOR operation of an input signal with a weight, each of the plurality of XNOR cells including at least one pair of FE-FETs and a plurality of selection transistors coupled with the at least one pair of FE-FETs, the at least one pair of FE-FETs coupled with a portion of the plurality of input lines and storing the weight, the at least one pair of FE-FETs including a first FE-FET and a second FE-FET, the first FE-FET receiving the input signal and storing a first weight, the second FE-FET receiving the input signal complement and storing a second weight, the first FE-FET including a first drain and a first source coupled with a first input line of the plurality of input lines, the second FE-FET including a second drain and a second source coupled with a second input line of the plurality of input lines, the first drain being coupled with the second drain to form a dynamic storage node; and wherein each of the plurality of XNOR cells further includes a reset transistor having a reset transistor source, a reset transistor gate and a reset transistor drain, the reset transistor source being connected to the dynamic storage node and wherein the neural network further includes
a plurality of reset lines, each of the plurality of reset lines being coupled with the reset transistor gate of at least one of the plurality of XNOR cells.

14. A method for performing a digital XNOR operation comprising:
providing an input signal and the input signal complement to an XNOR cell for performing a digital XNOR operation of the input signal with a weight, the XNOR cell including at least one pair of FE-FETs, a plurality of selection transistors coupled with the at least one pair of FE-FETs and a reset transistor, the at least one pair of FE-FETs coupled with a plurality of input lines and storing the weight, the at least one pair of FE-FETs including a first FE-FET and a second FE-FET, the first FE-FET receiving the input signal and storing a first weight, the second FE-FET receiving the input signal complement and storing a second weight, the first FE-FET and the second FE-FET being coupled to form a dynamic storage node, the reset transistor having a reset transistor source, a reset transistor gate and a reset transistor drain, the reset transistor source being connected to the dynamic storage node, the reset transistor gate being coupled with a reset line.

15. A method for performing a digital XNOR operation comprising:
providing an input signal and the input signal complement to an XNOR cell for performing a digital XNOR operation of the input signal with a weight, the XNOR cell including at least one pair of FE-FETs and a plurality of selection transistors coupled with the at least one pair of FE-FETs, the at least one pair of FE-FETs coupled with a plurality of input lines and storing the weight, the at least one pair of FE-FETs including a first FE-FET and a second FE-FET, the first FE-FET receiving the input signal and storing a first weight, the second FE-FET receiving the input signal complement and storing a second weight, wherein the plurality of selection transistors includes a first selection transistor and a second selection transistor, the plurality of FE-FETS consists of the first FE-FET and the second FE-FET, each of the selection transistors including a gate, a source and a drain, the source of the first selection transistor being connected a first gate of the first FE-FET, the source of the second selection transistor being connected to a second gate of the second FE-FET, the drain of the first selection transistor being coupled with a program line, the drain of the second selection transistor being coupled with a program complement line, the gate of the first selection transistor and the gate of the second selection transistor being coupled to a select line; and
programming the first weight and the second weight into the first FE-FET and the second FE-FET, the step of programming the first weight and the second weight further including
erasing the first FE-FET and the second FE-FET by setting the program line to a ground, setting the program complement line to the ground, setting the select line to a high state, setting an input line and an input complement line of the plurality of input lines to the high state; and writing to the first FE-FET and the second FE-FET after the erasing step by setting the input signal line to the ground, setting the input signal complement line to the ground, setting the select line to the high state, and one of pulsing the programming line, pulsing the program complement line and pulsing neither of the program line and the program complement line.

16. The method of claim 15 wherein the programming step uses non-negative voltages.

17. The method of claim 15 wherein the step of providing the input signal further includes:
    implementing a reset step and an evaluate step.

18. The method of claim 17 wherein the first FE-FET includes a first drain and a first source coupled with a first input line of the plurality of input lines, wherein the second FE-FET includes a second source coupled with a second input line of the plurality of input lines and a second drain, the second drain being coupled with the first drain to provide a dynamic storage node and wherein the XNOR cell further includes a reset transistor having a reset transistor source, a reset transistor gate and a reset transistor drain, the reset transistor source being connected to the dynamic storage node, the reset transistor being coupled to a reset line, the method further comprising:
    pulsing the reset line before the evaluate step.

19. The method of claim 17 further comprising:
    pulsing the program line, the program complement line and the select line high before the evaluate step.

20. The method of claim 15 wherein the step of providing the input signal further includes:
    setting the select line to the low state;
    providing the input signal on the input line and the input complement signal on the input complement line while the select line is in a low state.

* * * * *